(12) United States Patent
Spielberger et al.

(10) Patent No.: US 6,657,134 B2
(45) Date of Patent: Dec. 2, 2003

(54) STACKED BALL GRID ARRAY

(75) Inventors: Richard K. Spielberger, Maple Grove, MN (US); Ronald J. Jensen, Bloomington, MN (US); Thomas G. Wagner, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 2 days.

(21) Appl. No.: 09/998,348

(22) Filed: Nov. 30, 2001

(65) Prior Publication Data

US 2003/0102156 A1 Jun. 5, 2003

(51) Int. Cl.[7] .................................................. H05K 1/16
(52) U.S. Cl. ...................... 174/260; 174/262; 361/760; 361/803; 257/698; 257/738; 257/778
(58) Field of Search ................................. 174/260, 262, 174/263, 264; 361/760; 257/698, 737, 738, 778, 779

(56) References Cited

U.S. PATENT DOCUMENTS

| | | | |
|---|---|---|---|
| 4,897,918 A | * 2/1990 | Osaka et al. ................... 29/830 |
| 5,222,014 A | * 6/1993 | Lin ............................. 361/792 |
| 5,474,458 A | * 12/1995 | Vafi et al. ...................... 439/91 |
| 5,477,933 A | 12/1995 | Nguyen | |
| 5,598,036 A | 1/1997 | Ho | |
| 5,783,870 A | 7/1998 | Mostafazadeh et al. | |
| 5,874,776 A | 2/1999 | Kresge et al. | |
| 5,973,930 A | * 10/1999 | Ikeda et al. ................... 361/768 |
| 5,975,409 A | 11/1999 | Brofman et al. | |
| 5,990,545 A | 11/1999 | Schueller et al. | |
| 6,050,832 A | * 4/2000 | Lee et al. ...................... 439/91 |
| 6,059,579 A | * 5/2000 | Kresge et al. ................. 439/66 |
| 6,163,462 A | 12/2000 | Buck | |
| 6,174,175 B1 | * 1/2001 | Behfar et al. .................. 439/91 |
| 6,333,563 B1 | * 12/2001 | Jackson et al. ............. 257/778 |
| 6,335,491 B1 | * 1/2002 | Alagaratnam et al. ...... 174/260 |
| 6,362,437 B1 | * 3/2002 | Arai ........................... 174/260 |
| 6,479,760 B2 | * 11/2002 | Kimbara et al. ............ 174/260 |
| 2002/0041489 A1 | 4/2002 | Fritz | |

FOREIGN PATENT DOCUMENTS

JP 10 247706 9/1998

* cited by examiner

Primary Examiner—Kamand Cuneo
Assistant Examiner—I B Patel
(74) Attorney, Agent, or Firm—Matthew S. Luxton

(57) ABSTRACT

A ball grid array mounted circuit includes a stress relief substrate having spaced conductive vias extending between its surfaces and connection pads at the surfaces. Solder connections formed from solder balls connect between pads at the top surface and connection pads at an electronic component. Solder connections formed from solder balls connect between pads at the bottom surface and connection pads at a printed circuit board (PCB). The solder connections absorb at least a portion of the stress due to differences between the thermal coefficient of expansion of the electronic component and the PCB.

24 Claims, 3 Drawing Sheets

STACKED BALL GRID ARRAY

BACKGROUND OF THE INVENTION

This invention relates in general to the packaging of integrated circuits and more specifically to ball grid array (BGA) packages. In particular, this invention relates to the use of an interposer and may be referred to as a ball grid array package or a stacked ball grid array.

The emphasis on reduction in the physical size of electronic components and the increase in complexity results in a continuing need for integrated circuit packaging that will accommodate the smaller footprint, higher lead count and improved electrical and thermal performance needs. Ball grid array packages have been used to meet the need for integrated circuit packages having higher lead counts and smaller footprints. A BGA package is typically a square package which houses conductors which bring the chip connections to an external surface where they terminate in connection pads. Solder balls are located between the package pads and corresponding pads on a printed circuit board (PCB) and the solder balls are reflowed to form a permanent electrical connection.

Ceramic packages are typically used in high performance, high reliability integrated circuit packaging. Such packages must perform when subjected to hundreds or thousands of thermal cycles as part of reliability testing. The materials include silicon having a temperature coefficient of expansion (TCE) in the range of 2.5–4 ppm/degree C., ceramic having a TCE of approximately 7 ppm/degree C., and the PCB having a TCE in the range of about 12–25 ppm/degree C. A major issue with such BGA packages is the ability of these packages to withstand thermal cycling when attached to a PCB. During thermal cycling, the solder joints tend to fatigue at the package interface or the PCB interface because of the strain caused by the TCE mismatch between the ceramic package and the PCB. In the past, various approaches have been used to attempt to improve the performance of the package when it is subjected to thermal cycling. In one approach, it has been proposed that a flexible substrate is located between the package and the PCB with a BGA on the package side being offset from a BGA on the PCB side so that there is some open space between the edges of electrically connected solder balls. Balls on each side of the substrate are connected by traces on one surface of the substrate and by vias through the substrate. The offset supposedly allows the flexible substrate to warp during thermal cycling and absorb the stress caused by TCE mismatch. The substrate with the offset between corresponding solder balls and the traces on both surfaces is expensive to fabricate. Further, in many high lead count packages the ability of the packaging to thermally conduct heat from the package into the printed wiring board is a significant issue. The use of the traces on the flexible substrate is believed to offer significantly more thermal resistance to the transfer of heat away from the package. In another approach, the proposed substrate is rigid and the BGAs on both sides of the substrate are aligned and connected by vias. The rigid substrate has holes formed in spaces between the vias to reduce the amount of material that interconnects the solder balls so that, according to this approach, the substrate tends to flex rather than transfer the TCE stress to the solder balls.

A typical solder joint which is barrel shaped is known to have a limited life due to the stress concentration at the interface between the solder connection and the substrate. It is known that changes in shape away from a spherical shape produce enhanced mechanical properties and testing has shown a greatly improved fatigue life for a connection having an hourglass shape. The stress concentration at the package and PCB interface with the connection is reduced by the hourglass shape of the connection. The stress is distributed more uniformly through the hourglass shape and not concentrated at the interface. Various approaches to change the shape of a solder joint including stretching the solder joint have been proposed.

In another approach, it has been proposed that a ceramic interposer be used to attach solder balls or columns to the LGA. The interposer is made out of alumina ceramic and has 90/10 Pb/Sn solder attached to it. The interposer is attached to the package with eutectic 63/37 Sn/Pb solder that is either printed on the package or provided with the interposer. This approach only uses a high temperature non-melting solder and does not accommodate a variety of solder balls and sizes. Also, since the solder column does not completely reflow, this method is not self-aligning. In addition, in some ceramic interposers the gap between the interposer and the LGA package is only about 4 mils, which makes flux clean up after soldering very difficult.

Thus, a need exists for a BGA package that will reduce the TCE stress during thermal cycling, provide excellent thermal performance and which can be easily fabricated.

SUMMARY

The present invention solves these and other needs by providing in a first aspect a ball grid array mounted circuit including a stress relief substrate having a top surface and a bottom surface with spaced conductive vias extending between the surfaces and pads at the surfaces capturing selected vias. First solder connections formed from solder balls connect between pads at the top surface and connection pads at an electronic component having a first thermal coefficient of expansion (TCE). Second solder connections formed from solder balls connect between pads at the bottom and connection pads at a printed circuit board (PCB) having a second TCE. The first and second solder connections absorb at least a portion of the stress due to differences between the first TCE and the second TCE. In a second aspect, connection pads at the electronic component and at the PCB are sized to be larger than connection pads at the top surface and the bottom surface so that solder connections have an hourglass shape and provide improved stress relief.

DESCRIPTION OF THE PREFERRED EMBODIMENT

Figure 1:
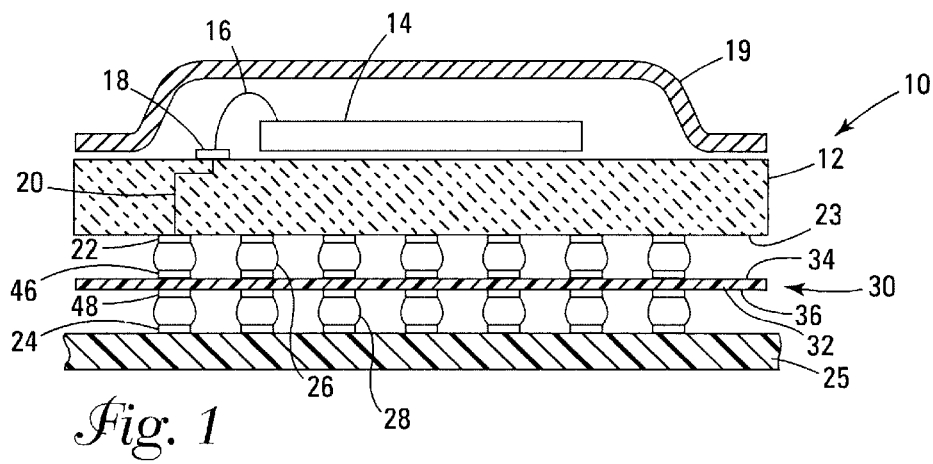
FIG. 1 is a cross-sectional view of a BGA package including an interposer between an electronic component and a printed circuit board according to the principles of the present invention.
Figure 2:
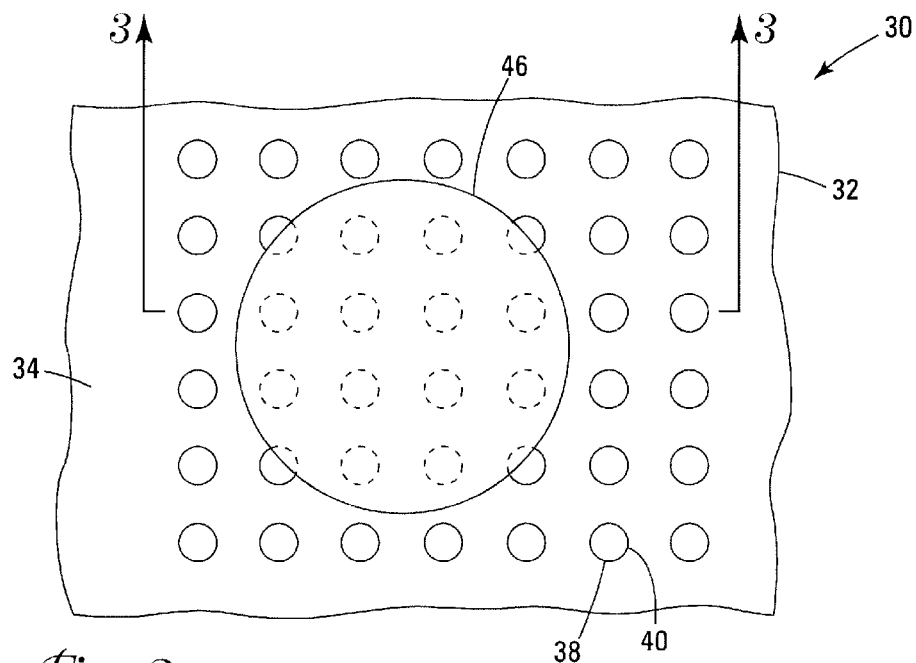
FIG. 2 is a partial top plan view of the interposer of FIG. 1 showing additional details.
Figure 3:
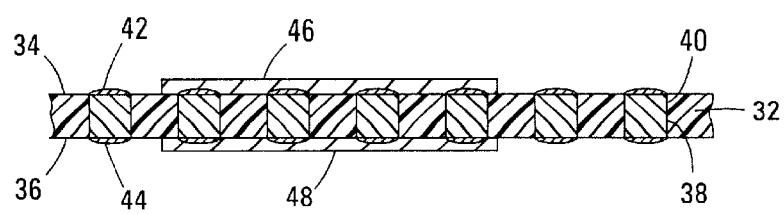
FIG. 3 shows a cross-sectional view of the interposer of FIG. 2 according to section line 3—3 of FIG. 2.

A BGA package according, to the principles of the present invention is shown in the drawings and generally designated 10. BGA package 10 includes a Land Grid Array (LGA) package 12 which receives an integrated circuit (IC) die or chip 14 and includes a domed lid 19. Die 14 is electrically connected by wirebonds 16 to pad 18 and in turn by internal wiring 20 to contact pad 22 located at surface 23 of LGA package 12. The present invention includes an interposer 30 located between LGA package 12 and printed circuit board 25. Connections 26 and 28 formed of reflowed solder connect to LGA package 12 at contact pad 22 and printed circuit board (PCB) 25 at contact pad 24 respectively. With reference to FIGS. 2 and 3, interposer 30 includes a flexible substrate 32 of polyimide or similar material having a top surface 34, bottom surface 36 and relatively closely spaced conductive vias 38 formed in holes 40 extending through substrate 32. Flexible substrate 32 is formed of polyimide or an equivalent material, typically in the range of about 2 to 5 mils thickness. Holes 40 typically having a diameter of 1 to 5 mils and having a pitch of 2 to 10 mils are formed in substrate 32. Holes 40 are filled with a conductive material, e.g. copper or gold using any of a variety of known processes such as electroplating. At surface 34 and surface 36, the copper or gold which fills holes 40 may be plated as shown by plated portions 42 and 44, e.g. if copper is used to fill the holes, then it may be plated with nickel. Providing plated portions 42 and 43 is not necessary to the invention, but may be used in some applications. The next step in the formation of interposer 30 is to form copper pads 46 and 48 on top surface 34 and bottom surface 36 respectively of substrate 32. Copper pads 46 and 48 may be formed by depositing copper and then patterning the copper to form the pads using various known processes, e.g., by using an additive electroplating process. According to the principles of the present invention, each copper pad will typically capture a number of conductive vias 38 as shown in FIGS. 2 and 3. Copper pads 46 and 48 may be formed directly over conductive vias 38 of copper without providing plated portions 42 and 44. Conductive pads 46 and 48 will typically be in the range of 20 to 30 mils in diameter. Thus, one pad will easily capture several vias.

After formation of conductive vias 38 and pads 46, 48, the construction of BGA package 10 continues by providing a graphite fixture 50 having spaces 52 into which a first level of solder balls 54 may be loaded. Interposer 30 is then positioned within fixture 50 over the first level of solder balls with pads 48 aligned with solder balls 54. A graphite fixture 56 having holes 58 is next placed within fixture 50 over interposer 30 with pads 46 aligned with holes 58. A second level of solder balls 60 is then loaded into holes 58 of graphite fixture 56. The assembly made up of fixture 50, balls 54, interposer 30, fixture 56 and solder balls 60 is then heated to cause the solder balls 54 and 60 to reflow and wet pads 46 and 48 so that interposer 30 is laden with solder balls 54 and 60. An alternative process is to use graphite fixture 50 to load solder balls 54 into spaces 52. Next interposer 30 is positioned over solder balls 54 with pads 48 aligned with balls 54. The assembly is then heated sufficiently to melt solder balls 54 causing them to adhere to pads 48. Next, interposer 30 laden with solder balls 54 may be removed from fixture 50 and a second array of solder balls is loaded into spaces 52. Interposer 30 is then again positioned in fixture 50 with solder balls 54 facing up and pads 46 aligned with the second array of solder balls. The assembly is then reheated causing the second array of solder balls to adhere to pads 46. Other processes, for example screen printing solder onto interposer 30 and using a pick up tool to place solder balls could be used.

Figure 4:
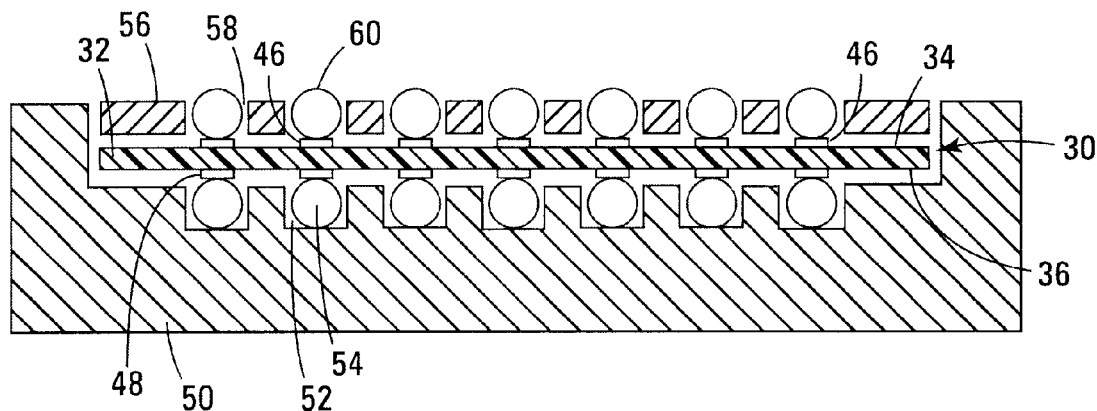
FIG. 4 is a cross-sectional view illustrating a method of attaching solder balls to the interposer of FIGS. 2 and 3.
Figure 5:
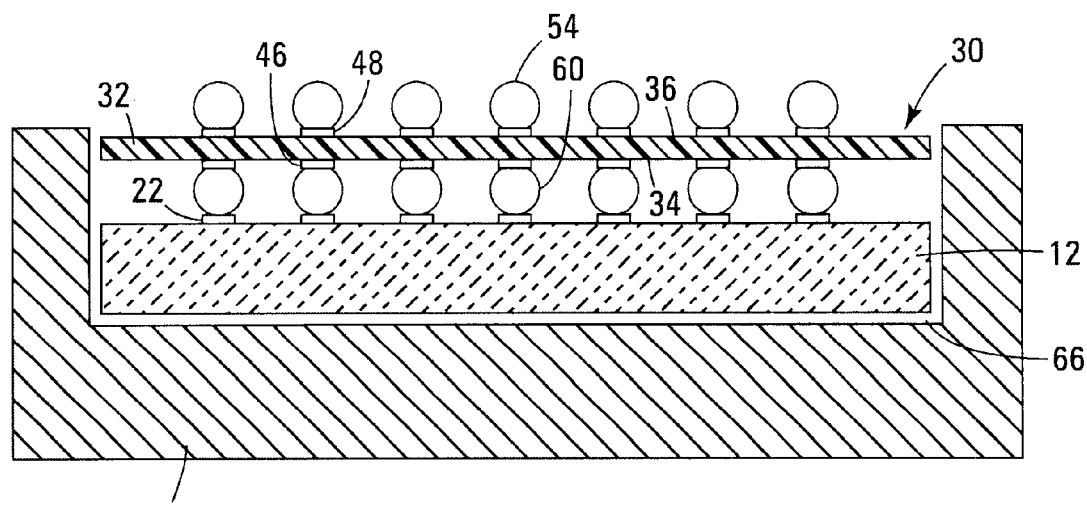
FIG. 5 is a cross-sectional view illustrating the attachment of the interposer of FIG. 2 including adhered solder balls to an LGA package.
Figure 8:
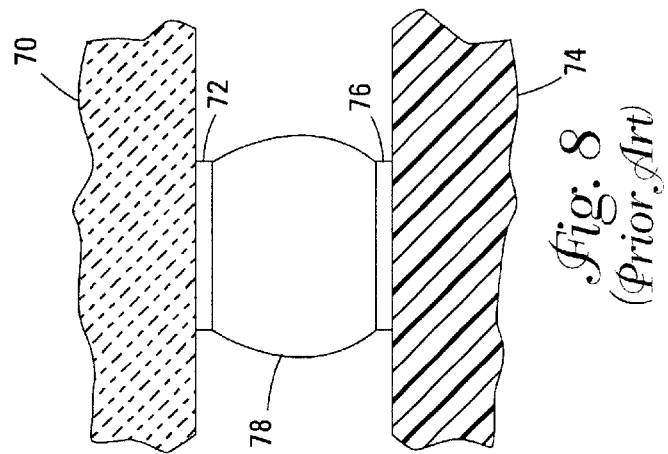
FIG. 8 is a greatly enlarged cross-sectional view of a connection between an electronic component and a printed circuit board as found in the prior art.

Further assembly of BGA package 10 continues by providing a package assembly fixture 64 of graphite having a cavity 66 sized to receive LGA package 12 which is loaded into package assembly fixture 64 with pads 18 facing upward. Solder laden interposer 30 is then inverted from FIG. 4 and positioned within package assembly fixture 64 with interposer to package solder balls 60 aligned with pads 22. Solder balls 60 are then reflowed and the assembly of LGA package 12 and interposer 30 is now ready for mounting to a PCB. The assembly of LGA package 12 and interposer 30 including solder balls 54 and 60 is then positioned over PCB 25 with solder balls 54 aligned with pads 24 and heated to cause solder balls 54 to reflow, wet pads 24 and form solder connection 28. Advantages of the BGA package of the present invention may be appreciated when compared to the prior art. FIG. 8 illustrates a connection between an electronic component and a PCB, as found in the prior art, including an electronic component 70 having a connection pad 72 and a PCB 74 having a connection pad 76. Solder connection 78 formed from a solder ball connects pad 72 with pad 76. When the connection of FIG. 8 is subjected to temperature cycling, differences between the TCE of electronic component 70 and PCB 74 will cause stresses on solder connection 78 at pad 72 and 76. The barrel shaped structure of solder connection 78 is of very low height and is not ductile. Connection 78 does not provide appreciable stress relief and consequently solder connection 78 may fail at pad 72 or pad 76.

Figure 6:
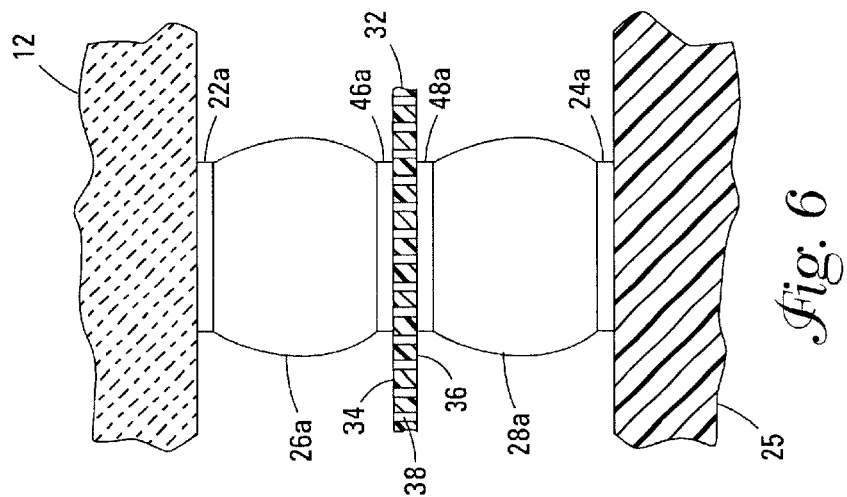

FIG. 6 illustrates a connection, according to the principles of the present invention, between electronic components 12 and PCB 25 in which pad 22a, pad 46a, pad 48a and pad 24a are approximately the same size. By comparison to FIG. 8, it can immediately be appreciated that the greater height of the connection illustrated in FIG. 6 will provide a more compliant connection and significantly greater stress relief than the connection shown in FIG. 8

Figure 7:
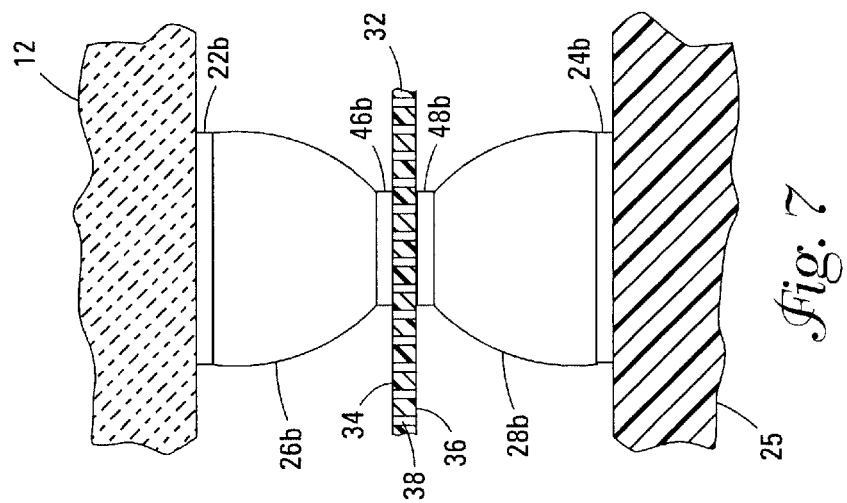
FIGS. 6–7 are greatly enlarged cross-sectional views of examples of the solder connections of FIG. 1 showing additional details.

According to the principles of the present invention, additional advantages are realized when connection pads 22 on electronic component 12 and connection pads 24 on PCB 25 are sized to be substantially larger than connection pads 46 and 48 respectively on interposer 30. Then, as illustrated in FIG. 7, when solder balls 54 reflow and wet pads 24, the larger size pads 24, according to the principles of the present invention, cause a larger volume of solder to form near pads 24 than is formed near pads 48. Therefore the cross sectional area of solder joint 26b, for example is substantially larger at pad 22b than it is at pad 46b. As shown in FIG. 7 BGA package 10 includes shaped connections between LGA package 12 and PCB 25 with the combined shape of solder connections 26 and 28 being an hourglass shape. This shape is realized by deliberately sizing connection pads 22 at package 12 and connection pads 24 at PCB 25 so that a significantly greater volume of solder will be formed by the reflow process near pads 22 and 24 than at pads 46 and 48 respectively of interposer 30. For example, it is believed that interposer pads in the range of about 15 to 20 mils diameter used with PCB pads and LGA pads of about 26 mils diameter and solder balls in the range of about 25–35 mils in diameter will provide good performance. It is to be understood that the mounting of the assembly of interposer 30 and LGA package 12 to PCB 25 may occur after delivery of the assembly to a customer and therefore may be performed at the customer's facility or another facility, and appropriate coordination of these activities is necessary.

Now that the construction and operation of BGA package 10 have been set forth, many advantages can be set forth and appreciated. Package 10 improves the reliability of conventional BGA solder connections by providing a solder joint that is much taller and more compliant than the solder joint of a conventional BGA package. The taller the solder joint the greater its resistance to thermal fatigue. The solder balls can be high-melting temperature solders (such as 10/90 Sn/Pb) that do not melt, or they can be low-melting temperature solders (such as 63/37 Sn/Pb, 60/40 SN/Pb, or 46/46/8 Sn/Pb/Bi) that melt completely. The high temperature solders can be attached to the polyimide with low melting temperature solders. The solders are reflowed to the polyimide interposer at temperatures between 220 to 350 degrees C., depending on their liquidus temperatures.

The thermal and electrical performance of BGA package 10 is greatly enhanced by vertically aligning the solder balls utilizing multiple copper vias 38 to connect solder balls 54 and 60 on opposite sides of substrate 32. This provides a direct thermal conductivity path through high thermal conductive materials, e.g., solder and copper, having a large cross section so as not to constrict the flow of heat through interposer 30 Multiple conductive vias, for example of copper, can be provided of a size and quantity for the application. Substrate 32 is shown with evenly spaced conductive vias 38 and may be obtained commercially as the type of z-axis connector material made for membrane probe card and flexible ribbon connector applications. It would then be necessary to process the material to provide pads 46 and 48. In some applications, it may be desirable to use a substrate material that only locates vias where they will be connected by pads rather than the uniform spacing of holes as shown. If vias are only located where they will be connected by pads it would avoid any concern regarding pads capturing only a portion of some of the vias and affecting the flow of the solder on the pad. In some applications, a single conductive via 38 may be appropriate; however, the ease of fabricating a greater number of vias of a smaller size rather than a larger single via is believed to offer an advantage in most applications.

The present invention has been illustrated with reference to a ceramic LGA; however, the present invention is not limited to such a package type. The invention may offer advantages when used with any package without leads. For example, the invention applies to a plastic BGA package. The invention may also be used with chip scale packages that are only slightly larger than the semiconductor die and have balls spaced on a pitch in the range of about 10 to 40 mils, e.g. 32 mil or 20-mil pitch. It is to be understood that in applications such as chip scale packaging, the connection pads on substrate 30 and the solder balls would be proportionally smaller than described hereinbefore. The invention may be used with large ruggedized semiconductor die or chip intended for mounting directly to a PCB. Such ruggedized chips are formed using known wafer level chip scale processing. Such chips typically have an array of connection pads located above a protective layer over the chip and at a central portion of the chip. The interposer of the present invention with proportional sizing of the pads and solder balls would be used between the array of connection pads and the PCB.

Thus, since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than the foregoing description, and all changes which come within the meaning and range of equivalency of the claims are intended to be embraced therein.

What is claimed is:

1. A ball grid array mounted circuit comprising:
    a flexible stress relief substrate having a top surface and a bottom surface;
    spaced conductive vias extending between the top surface and said bottom surface;
    connection pads it said top surface with each connection pad capturing at least one of said vias;
    connection pads at said bottom surface connected by said conductive vias with said connection pads at said top surface;
    an electronic component having a first thermal coefficient of expansion (TCE) and having connection pads larger than and spaced to substantially align with said connection pads at said top surface;
    first solder connections formed from solder balls between said connection pads at said top surface and said component connection pads;
    a printed circuit board (PCB) having a second TCE and having connection pads larger than and spaced to substantially align with said connection at said bottom surface;
    second solder connections formed from solder balls between said connection pads at said bottom surface and said PCB connection pads, wherein said first solder connections have a smaller cross section at said pads at said top surface than at said component connection pads and said second solder connections have a smaller cross section at said pads at said bottom surface than at said PCB connection pads to absorb at least a portion of the stress due to differences between said first TCE and said second TCE.

2. Ball grid array mounted circuit of claim 1 wherein said flexible stress relief substrate has a thickness in the range of about 2 to 5 mils.

3. Ball grid array mounted circuit of claim 2 wherein said connection pads at said top surface capture a plurality of said conductive vias.

4. Ball grid array mounted circuit of claim 2 wherein said conductive vias have a diameter in the range of 1 to 5 mils and a pitch in the range of 2 to 10 mils.

5. Ball grid array mounted circuit of claim 2 wherein said connection pads at said top surface and said connection pads at said bottom surface have a diameter in the range of about 20 to 30 mils.

6. Ball grid array mounted circuit of claim 2 wherein said electronic component is a ceramic package having a TCE of about 7 ppm/degree C. and said PCB has a TCE in the range of about 12–25 ppm/degree C.

7. Ball grid array mounted circuit of claim 2 wherein said electronic component is a chip scale package and said conductive vias have a pitch in the range of about 10 to 40 mils.

8. Ball grid array mounted circuit of claim 2 wherein said electronic component is a ruggedized die having an array of pads suitable for mounting to a PCB.

9. Ball grid array mounted circuit of claim 2 wherein said conductive vias are located in said flexible substrate only at said connection pads.

10. A ball grid array mounted circuit comprising:
    a flexible stress relief substrate having a top surface and a bottom surface;
    spaced conductive vias extending between the top surface and said bottom surface;

connection pads at said top surface with each connection pad capturing at least one of said vias;

connection pads at said bottom surface connected by said conductive vias with said connection pads at said top surface;

an electronic component having a first thermal coefficient of expansion (TCE) and having connection pads spaced to align with said connection pads at said top surface, said electronic component connection pads being of a larger size than said connection pads at said top surface;

solder connections formed from solder balls between said connection pads at said top surface and said component connection pads, with said larger size pads causing said solder connections to have a substantially greater larger cross section at said component connection pads than at said connection pads at said top surface;

a PCB having a second TCE and having connection pads aligned with said connection pads at said bottom surface, said PCB connection pads being of a larger size than said connection pads at said bottom surface;

solder connections formed from solder balls between said connection pads at said bottom surface and said PCB connection pads with said larger size pads causing said solder connections to have a larger cross section at said PCB connection pads than at said connection pads at said bottom surface; and wherein connections formed between said component connection pads and said PCB connection pads have an hourglass shape, and act to absorb at least a portion of the stress due to differences between said first TCE and said second TCE.

11. Ball grid array mounted circuit of claim 10 wherein said flexible stress relief substrate has a thickness in the range of about 2 to 5 mils.

12. Ball grid array mounted circuit of claim 10 wherein said connection pads at said top surface capture a plurality of said conductive vias.

13. Ball grid array mounted circuit of claim 10 wherein said conductive vias have a diameter in the range of 1 to 5 mils and a pitch in the range of 2 to 10 mils.

14. Ball grid array mounted circuit of claim 10 wherein said connection pads at said top surface and said connection pads at said bottom surface have a diameter in the range of about 20 to 30 mils.

15. Ball grid array mounted circuit of claim 10 wherein said electronic component is a ceramic package having a TCE of about 7 ppm/degree C. and said PCB has a TCE in the range of about 12–25 ppm/degree C.

16. Ball grid array mounted circuit of claim 10 wherein said conductive vias are uniformly spaced throughout said flexible substrate.

17. Ball grid array mounted circuit of claim 10 wherein said conductive vias are located in said flexible substrate only at said connection pads at said top surface.

18. An interposer assembly making first connections to an electronic component having a first thermal coefficient of expansion (TCE) and second connections to a printed circuit board (PCB) having a second TCE in a ball grid array mounted circuit comprising:

a flexible stress relief substrate having a top surface and a bottom surface;

spaced conductive vias extending between the top surface and said bottom surface;

connection pads at said top surface with each connection pad capturing at least one of said vias;

said first connections formed from solder balls between said connection pads at said top surface and connection pads located at a surface of said electronic component wherein said first solder connections have a smaller cross sectional area at said connection pads at said top surface than at said connection pads located at said electronic component;

connection pads at said bottom surface connected by said conductive vias with said connection pads at said top surface;

said second connections formed from solder balls between said connection pads at said bottom surface and connection pads located at said PCB wherein said second solder connections have a smaller cross sectional area at said connection pads at said bottom surface than at said connection pads located at said PCB; and wherein a combination of said first connections and said second connections have hour-glass shapes which are sufficiently compliant to absorb at least a portion of the stress related to a difference in said first TCE and said second TCE.

19. The interposer assembly of claim 18 wherein said flexible stress relief substrate has a thickness in the range of about 2 to 5 mils.

20. The interposer assembly of claim 18 wherein said conductive vias have a diameter in the range of 1 to 5 mils and a pitch in the range of 2 to 10 mils.

21. The interposer of claim 20 wherein said connection pads at said top surface and said connection pads at said bottom surface have a diameter in the range of about 20 to 30 mils.

22. A method for electrically interconnecting an electronic component to a printed circuit board (PCB) comprising the steps of:

providing an electronic component having an exterior surface having an array of connection pads of a first size;

providing a stress relief substrate having a top surface and a bottom surface, spaced conductive vias extending between said top surface and said bottom surface, connection pads at said top surface with each connection pad capturing a plurality of said vias and connection pads at said bottom surface connected by said conductive vias with said connection pads at said top surface, said connection pads at said top surface and said connection pads at said bottom surface being of a size smaller than said first size;

providing first solder balls;

providing second solder balls;

positioning said connection pads at said bottom surface at said first solder balls;

positioning said second solder balls at said connection pads at said top surface;

heating said first and second solder balls to a temperature sufficient to melt said first and second solder balls thereby forming a first assembly with said solder balls adhered to said connection pads;

positioning said first assembly so that said second solder balls are substantially aligned with said connection pads of a first size;

heating said second solder balls to a temperature sufficient to melt said second solder balls and form solder connections with said connection pads of a first size shaping said solder connection to have a larger cross section at said connection pads of a first size than at said connection pads at said top surface;

providing a PCB having an array of connection pads of a second size wherein said second size is larger than said connection pads at said bottom surface; and heating said first solder balls to a temperature sufficient to melt said first solder balls and form solder connections with said connection pads of a second size shaping said solder connections to have a larger cross section at said connection pads of a second size than at said connection pads at said bottom surface.

23. The method of claim 22 wherein said step of positioning said first solder balls at said connection pads at said bottom surface comprises the steps of:

providing a fixture having an array of spaces for receiving solder balls;

loading said first solder balls into said fixture; and positioning said stress relief substrate so that said connection pads at said bottom surface align with and abut said first solder balls.

24. The method of claim 22 wherein said step of positioning said second solder balls at said connection pads at said top surface comprises the steps of:

providing a fixture having an array of spaces for receiving solder balls;

positioning said fixture so that said array of spaces align with said connection pads at said top surface; and loading said second solder balls into said fixture.

\* \* \* \* \*

UNITED STATES PATENT AND TRADEMARK OFFICE
CERTIFICATE OF CORRECTION

| | | |
|---|---|---|
| PATENT NO. | : 6,657,134 B2 | Page 1 of 1 |
| APPLICATION NO. | : 09/998348 | |
| DATED | : December 2, 2003 | |
| INVENTOR(S) | : Richard K. Spielberger et al. | |

It is certified that error appears in the above-identified patent and that said Letters Patent is hereby corrected as shown below:

Col. 6, Line 10 (Claim 1), "connection pads it said" should be --connection pads at said--

Col. 7, Line 14 (Claim 10), "connections to have a substantially greater larger" should be --connections to have a larger--

Col. 8, Line 25 (Claim 20), "assembly of claim 18 wherein" should be --assembly of claim 19 wherein--

Signed and Sealed this

Sixteenth Day of March, 2010

David J. Kappos
*Director of the United States Patent and Trademark Office*